(12) United States Patent
Tanii et al.

(10) Patent No.: US 8,666,474 B2
(45) Date of Patent: Mar. 4, 2014

(54) MAGNETIC-FIELD MEASUREMENT JIG, MAGNETIC-FIELD MEASUREMENT PROGRAM, AND INSPECTION DEVICE PROVIDED WITH MAGNETIC POSITION DETECTOR

(75) Inventors: Michiyo Tanii, Tokyo (JP); Shingo Kawasaki, Tokyo (JP); Michiyuki Fujiwara, Tokyo (JP); Takashi Ishizuka, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 13/503,956

(22) PCT Filed: Oct. 15, 2010

(86) PCT No.: PCT/JP2010/068137
§ 371 (c)(1),
(2), (4) Date: Apr. 25, 2012

(87) PCT Pub. No.: WO2011/052402
PCT Pub. Date: May 5, 2011

(65) Prior Publication Data
US 2012/0209105 A1    Aug. 16, 2012

(30) Foreign Application Priority Data
Oct. 27, 2009   (JP) ................................. 2009-246755

(51) Int. Cl.
*A61B 5/06* (2006.01)
(52) U.S. Cl.
USPC ........................................................ 600/409
(58) Field of Classification Search
None
See application file for complete search history.

(56) References Cited

U.S. PATENT DOCUMENTS

| 6,122,538 A * | 9/2000 | Sliwa et al. | 600/407 |
| 6,860,853 B2 * | 3/2005 | Hashimoto | 600/446 |
| 2007/0239004 A1 * | 10/2007 | Kakee et al. | 600/437 |

FOREIGN PATENT DOCUMENTS

| JP | 10-151331 | 6/1998 |
| JP | 2001-198112 | 7/2001 |
| JP | 2004-101273 | 4/2004 |
| JP | 2005-537583 | 12/2005 |
| JP | 3871747 | 10/2006 |
| JP | 2008-086742 | 4/2008 |
| WO | 2004/023783 | 3/2004 |

OTHER PUBLICATIONS

International Search Report from International Application No. PCT/JP2010/068137 mailed Nov. 9, 2010.

\* cited by examiner

*Primary Examiner* — Long V Le
*Assistant Examiner* — Kevin Pontius
(74) *Attorney, Agent, or Firm* — Brundidge & Stanger, P.C.

(57) ABSTRACT

To provide a highly reliable inspection device that prevents a loss in reliability of inspection that uses information from a position detector as a result of the influence of magnetic bodies or the like that are present in the environment, the inspection device includes biological information measurement units that measure biological information of an inspected target and form an image containing the biological information, a magnetic position detector that detects the position of at least one of the biological information measurement units and the inspection target, and a control unit that controls the biological information measurement units and the magnetic position detector; and further includes the control unit being provided with an environmental magnetic field measurement unit that uses the output of the magnetic position detector to measure distortion of the magnetic field in the measured space in which the biological information measurement units are placed.

15 Claims, 14 Drawing Sheets

FIG.6
(a)
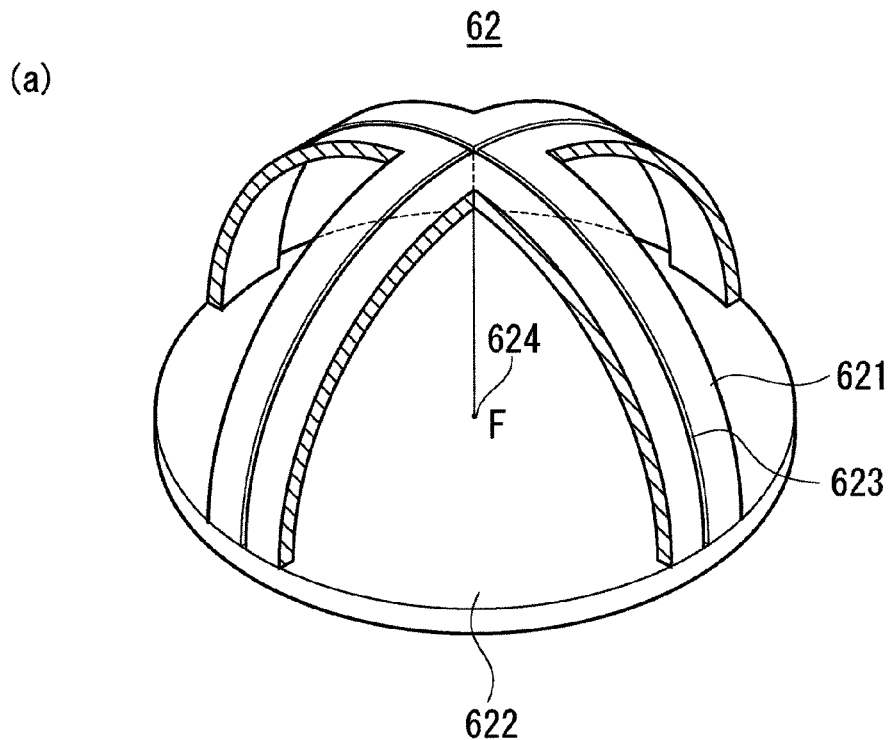
(b)
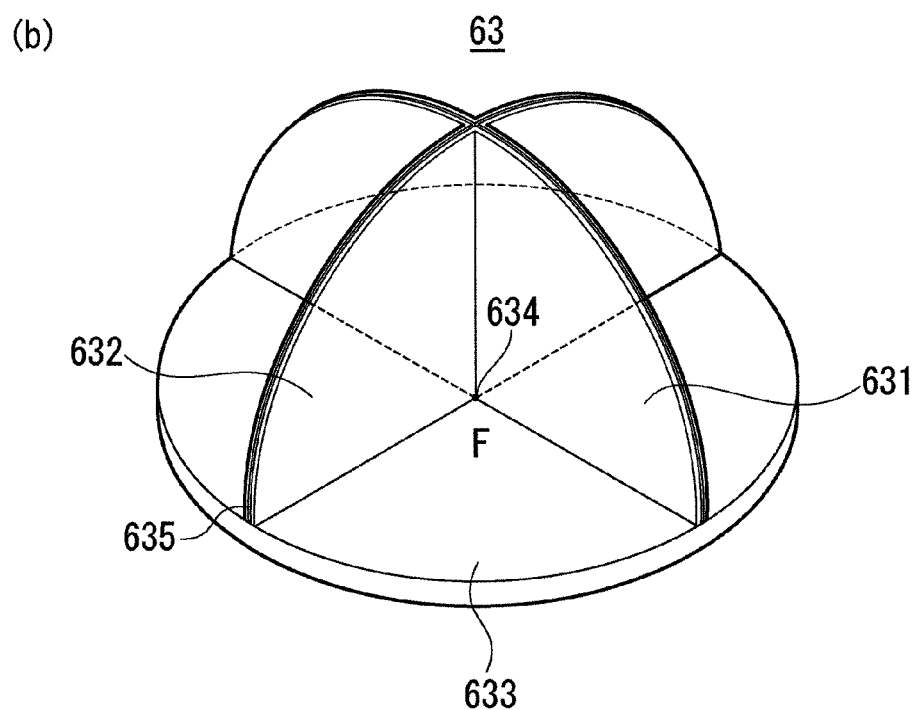

MAGNETIC-FIELD MEASUREMENT JIG, MAGNETIC-FIELD MEASUREMENT PROGRAM, AND INSPECTION DEVICE PROVIDED WITH MAGNETIC POSITION DETECTOR

FIELD OF THE INVENTION

The present invention relates to an inspection device that acquires biological information of an inspection target and generates an image thereof such as a biological measurement optical instrument, ultrasonic image diagnostic apparatus or X-ray CT apparatus. In particular, the present invention relates to an inspection device provided with a magnetic position detector that verifies positional relationship of a biological information measurement unit and the inspection target.

DESCRIPTION OF RELATED ART

In an inspection device such as a biological optical measurement instrument, a position detector is used to verify the positional relationship of the inspection device and an object to be examined. For example, in a biological optical measurement instrument, the end of optical fibers referred to as probes are applied to an inspection region such as the head region of an inspection target, light is irradiated to the inspection region and the light transmitted through the inspection region is received, and an activated region, etc. in the brain is inspected from the waveforms of the electric signals that are converted from the received light. The result of such acquired light measurement is the information that represents the variation of light signals at the measurement positions, and the output screen by which the information can be intuitively recognized can be provided by executing mapping on a 3-dimensional wire frame of a human head region. Verification of the end-position of optical fibers is fundamental to execute this mapping process, and the technique based on a combination of a biological optical measurement instrument and a 3-dimensional position detector has been developed (Patent Document 1).

Verification of optical fiber positions is fundamental not only for mapping, but also for executing a plurality of measurements to the same inspection object at different times so as to execute measurements in the same condition. For example, in the case of comparing a plurality of measurement results, the record of the end-positions of optical fibers affixed to a head region is necessary, since it is required that the measurement positions in the head region of the object stay the same.

Also in ultrasonic diagnostic apparatuses, the technique has been developed capable of executing measurement while verifying the position of a probe for transmitting and receiving ultrasonic waves by a 3-dimensional position detector, so as to create and display a cross-sectional image on the position of the detected probe from the previously obtained volume image such as a CT image (Patent Document 2).

There is also a technique to support surgery referred to as interventional radiography that specifies a desired position in a patient during surgery using a device such as a pointer, detects the position of the pointer by a 3-dimensional position detector and images the detected position in real time by an imaging apparatus such as a CT.

Though there is an optical or a mechanical 3-dimensional position detector in addition to a magnetic 3-dimensional position detector, magnetic position sensors are often used as inspection devices except when the image diagnostic apparatus has a magnetic-field generation device such as an MRI apparatus, since the magnetic detectors are less likely to be affected by masking and have high level of flexibility.

PRIOR ART DOCUMENTS

Patent Documents

Patent Document 1: JP-A-2001-198112
Patent Document 2: Japanese Patent Number 3871747

However, in the case that there is a material which affects the magnetic field such as a magnetic material in the environment in which an inspection device is placed, a magnetic position detector has a problem in acquiring accurate positional information since reliability of measurement result is degraded. The material that affects a magnetic field is, for example an iron sheet which is built inside of a wall or ceiling of an examination room or iron included in the material placed in the room. Those materials are difficult to visually identify, and measurements can be performed without recognizing the existence thereof. In such cases, for example in biological optical measurement, the measurement result is executed with mapping process at the position on the 3-dimensional wire frame that is displaced from the actual measurement region, which interferes with acquisition of a highly reliable diagnostic result. Also in an ultrasonic diagnostic apparatus, an actually displayed cross section can be displaced from the cross section that is cut out from a volume image, which lowers the support performance of diagnostic display.

The objective of the present invention is to provide an inspection device capable of providing highly reliable inspection information while preventing degradation of reliability in inspection result, particularly degradation of the inspection performance using the information from a position detector, that is attributed to the existence of magnetic materials, etc. in the environment.

BRIEF SUMMARY OF THE INVENTION

In order to achieve the above-described objective, the inspection device of the present invention comprises a magnetic position detector and a control unit which controls the magnetic position detector, wherein the control unit has the function to detect the magnetic field in the environment in which the inspection device is placed.

The inspection device of the present invention comprises:

a biological information measurement unit configured to measure biological information of an inspection target and forms an image including the measured biological information;

a magnetic position detector configured to detect the position of the biological information measurement unit and/or the inspection target; and a control unit configured to control the biological information measurement unit and the magnetic position detector, wherein the control unit comprises a magnetic-field measurement unit configured to measure strain of a magnetic field in the measurement space in which the biological information measurement unit is placed using the output of the magnetic position detector.

In concrete terms, the output of the magnetic position detector is positional information of a plurality of points of a jig fixed in the measurement space, and the magnetic-field measurement unit measures strain of a magnetic field based on the positional information on the detected plurality of points.

The magnetic-field measurement unit also comprises a magnetic field determination unit configured to calculate the distance between the respective points of the jig using the positional information of the detected plurality of points, and determines the presence or absence of a magnetic field based on the comparison result between the calculated distance and the actual distance between the respective points.

The magnetic-field measurement jig of the present invention is for detecting a magnetic field in a measurement space in which a biological information measurement device is placed, formed by a polyhedron, and comprises a concave portion or a mark in at least a part of the plane which forms the polyhedron or at least a part of the joint of the planes, for engaging a part of a magnetic sensor.

Or, the magnetic-field measurement jig is formed by a circular basal plane and a hollow hemisphere covering the basal plane, comprising a concave portion or a mark at the center of the basal plane for engaging a part of a magnetic sensor and an aperture at the top of the hemisphere for the magnetic sensor to be inserted.

Or, the magnetic-field measurement jig comprises a circular basal plane and a member having a plane, which is fixed to the basal plane, including two semi-circular arcs that are perpendicular to the basal plane and orthogonal to each other, wherein the member is provided with lines or grooves along the circular arcs for a magnetic sensor to be moved.

Further, the magnetic-field measurement program of the present invention causes an arithmetic device of a biological information measurement device, for detecting a magnetic field in the measurement space in which the biological information measurement device is placed, to execute:

a step of activating a magnetic position detector placed in the space;

a step of loading positional information of a plurality of points in the measurement space which is detected by the magnetic position sensor and calculate the distance between the plurality of points;

a step of comparing previously stored actual distance between the plurality of points in the measurement space and the calculated distance; and a step of determining, when the difference between the actual distance and the calculated distance is greater than a predetermined threshold value, the presence of strain in the magnetic field between the relevant points.

EFFECT OF THE INVENTION

In accordance with the present invention, since a control unit of a biological information measurement device is provided with the environmental magnetic-field measuring function, the measurement can be executed in the environment without strain in the magnetic field, thereby improving reliability of the examination result.

Also, in accordance with the present invention, the magnetic-field measuring function can be configured in a simpler manner by using a jig prepared for measuring an environmental magnetic field, and a GUI which is more convenient for an operator to use can be provided by the magnetic-field measurement program.

BRIEF DESCRIPTION OF THE DRAWINGS

FIGS. 6(*a*) and (*b*) are perspective views showing a third embodiment and a fourth embodiment of a jig to be used for magnetic-field measurement.

DETAILED DESCRIPTION OF THE INVENTION

The embodiment will be described below wherein the inspection device of the present invention is applied to an optical topography device which is one of the biological optical measurement instruments.

A biological optical measurement instrument irradiates near-infrared light to the inside of an object, detects the light reflected from the vicinity of the surface of the object or transmitted through the object (hereinafter referred to as a transmitted light), and generates an electric signal corresponding to the intensity of the light, capable of recognizing blood moving state in a brain by measuring the light transmitted through the head region of the object and measuring the active state of the brain using the recognized blood moving state. The optical topography device irradiates light from a plurality of positions, measures the transmitted light at the plurality of positions, acquires the signals from a comparatively wide region including the plurality of positions, and displays the acquired signals as a distribution chart.

Figure 1:
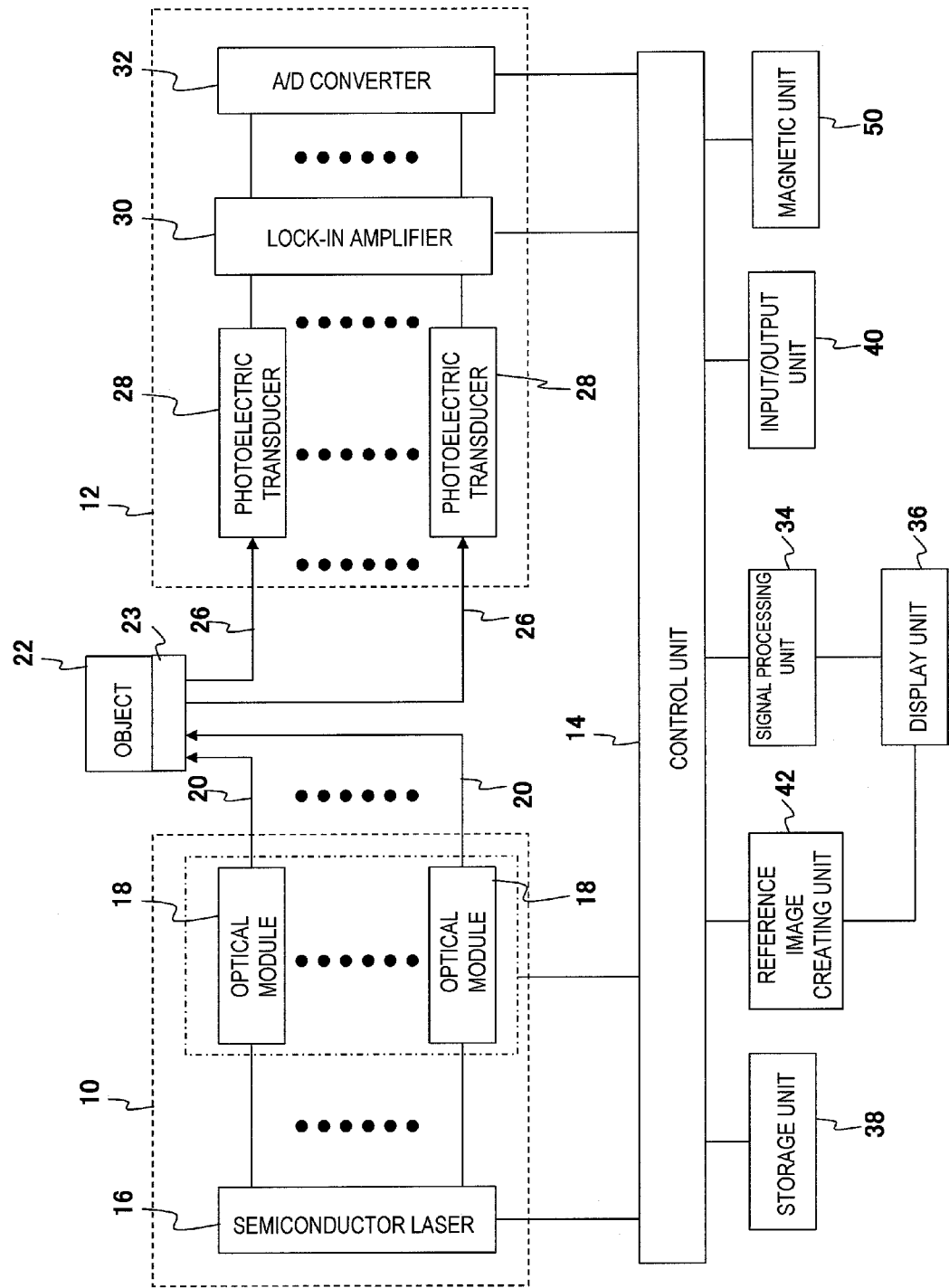
FIG. 1 is a block diagram showing the general outline of an optical topography device which is one embodiment of a biological information measurement device.

FIG. 1 shows a general outline of such optical topography device. This optical topography device mainly comprises, as shown in FIG. 1, a light source unit 10 configured to irradiate near-infrared light, a light measurement unit 12 configured to measure transmitted light and convert it into an electric signal, a control unit 14 configured to control the activation of the light source unit 10 and the light measurement unit 12, and a display unit 36.

The light source unit 10 comprises a semiconductor laser configured to irradiate light having a predetermined wavelength and a plurality of optical modules 18 provided with a modulator for modulating the light generated by the semiconductor laser 16 by a plurality of different frequencies, and the outputted light from the respective optical modules 18 is irradiated to a predetermined measurement position, for example a head region of an object 22 via irradiating optical fibers 20 respectively. The transmitted light from the object 22 is induced to the light measurement unit 12 by the detecting optical fibers 26. In order to affix the irradiating fibers 20 and detecting fibers 26 to the measurement positions of the object 22, a probe holder 23 is attached to the object 22, and the plurality of irradiating optical fibers 20 and detecting optical fibers 26 are detachably affixed to the respective setting positions (holes) of the probe holder 23.

While the wavelength of the light to be used for measurement differs depending on the spectral characteristic of a target substance in a living body, in the case that the oxygen saturation or amount of blood is measured from the concentration of oxygenated hemoglobin and deoxygenated hemoglobin, one or plural wavelengths are selected and used from the light within the wavelength range of 600 nm~1400 nm. In concrete terms, the light source unit 10 is configured to generate the light having two kinds of wavelengths, for example that are 780 nm and 830 nm, and these two wavelengths of lights are synthesized and irradiated from one irradiating position.

The light measurement unit 12 is formed by photoelectric transducers 28 which are photodiode, etc. configured to convert the transmitted light induced from a plurality of measurement positions via detecting optical fibers 26 into the electric quantity corresponding to the light quantity respectively, a lock-in amplifier 30 configured to input the electric signals from the photoelectric transducers 28 and selectively detect the modulated signals corresponding to the light irradiating positions, and an A/D converter 32 configured to convert the output signals from the lock-in amplifier 30 into digital signals.

The lock-in amplifier 30 selectively detects the light irradiating positions and the modulated signals corresponding to the two wavelengths. At this time, the light intensity variation signals are acquired in the number which is twice as many as the points between the light irradiating positions and the detecting positions (measurement points). In the case that a measurement target is hemoglobin, these signals are equivalent to the variation of hemoglobin amount, and are also referred to as hemoglobin variation signals.

Also, the optical topography device comprises a signal processing unit 34 configured to process the hemoglobin variation signals converted into the digital signals and create a graph for each channel or a 2-dimensional or 3-dimensional image in which the respective hemoglobin variation signals are interpolated for each channel, a reference image creating unit 42 configured to create a head-surface image, brain-surface image or measurement points, etc. of the object 22, a display unit 36 configured to display the information such as processing result of the signal processing unit 34, a head-surface image, a brain-surface image and measurement points, a storage unit 38 configured to store the necessary data for the process or the processing result of the signal processing unit 34 or the reference image creating unit 42, and an input/output unit 40 configured to input various commands necessary for operating the device. The storage unit 38 includes a magnetic disk, optical disk and other various portable media, besides the hard disk provided to the control unit 14.

Further, the optical topography device comprises a magnetic unit 50 as a magnetic position detector for verifying the setting positions of optical fibers of the probe holder 23 for setting the respective optical fibers 20 and 26.

Figure 2:
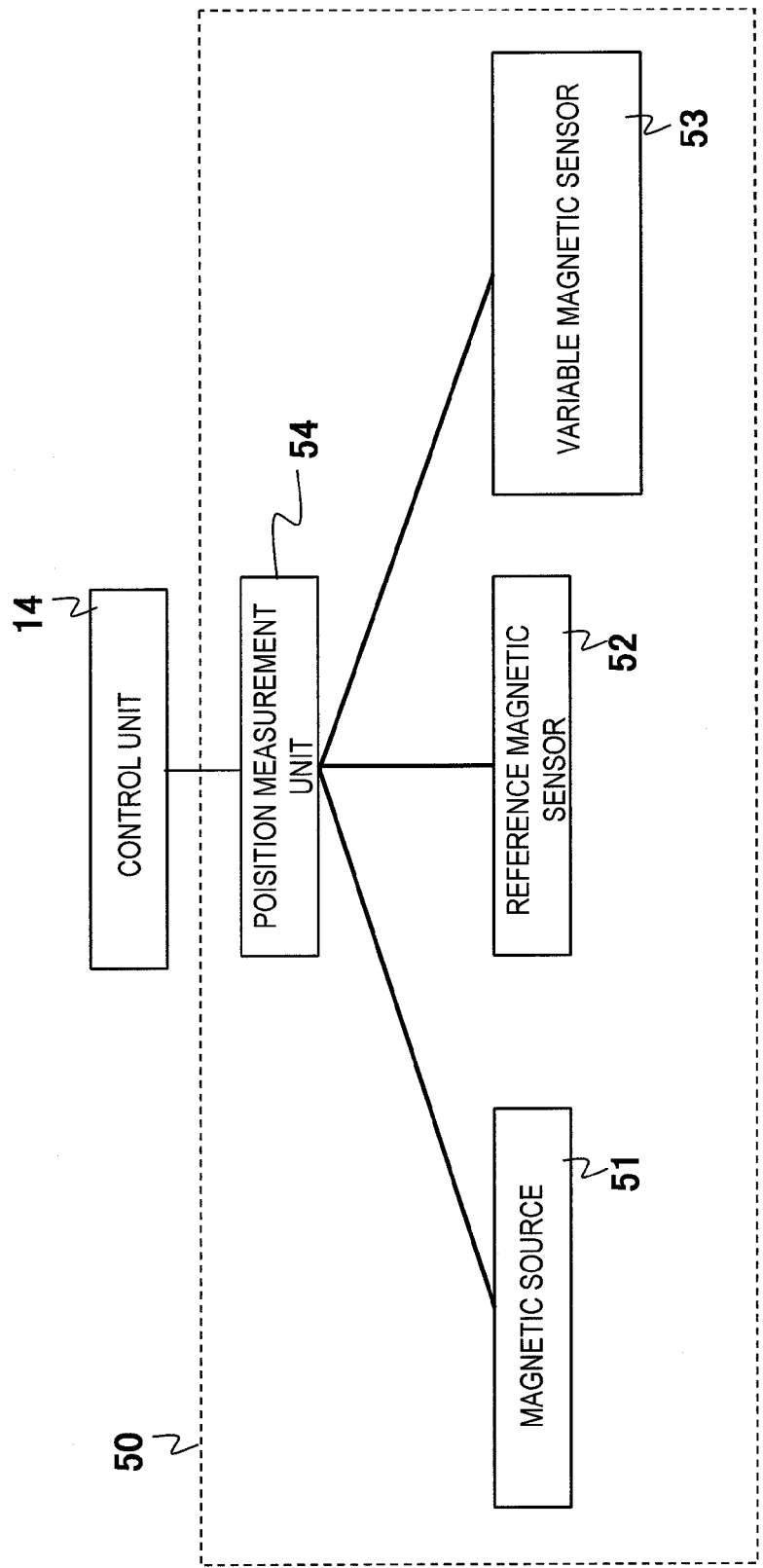
FIG. 2 is a block diagram showing the configuration of a magnetic unit which is one embodiment of a magnetic position detector.

FIG. 2 shows a configuration example of the magnetic unit 50. As shown in the diagram, the magnetic unit 50 is formed by a magnetic source 51, magnetic sensors 52 and 53, and a position measurement unit 54 configured to control the foresaid devices and to calculate the position and the angle of the magnetic sensor 52 with respect to the magnetic source 51. While the magnetic sensor is formed by the reference magnetic sensor 52 and the variable magnetic sensor 53 in the shown configuration example, it may also be formed only by the variable magnetic sensor 53. The positional measurement unit 54 is connected to the control unit 14, and the positional information measured by the position measurement unit 54 is transmitted to the signal processing unit 34 via the control unit 14.

The magnetic source 51 is formed by a magnetic generating coil that generates a magnetic field of triaxial orthogonal system, and generates a magnetic field in a 3-dimensional space. The magnetic source 51 is fixed, for example in a space in the vicinity of the place where a biological optical measurement instrument is installed.

The reference magnetic sensor 52 is placed in the magnetic field space generated by the magnetic source 51, and is attached to the probe holder 23 which is applied to the object 22 at the time of executing biological optical measurement. At the time of executing environmental magnetic-field measurement, the reference magnetic sensor 52 is fixed at a predetermined place in a magnetic field space.

The variable magnetic sensor 53 is a pen-shaped sensor referred to as a stylus pen, which can be moved freely in the magnetic field space generated by the magnetic source 51. In the variable magnetic sensor 53, a registration button (not shown in the diagram) is provided for registering the spatial position of the penpoint.

The position measurement unit 54 receives in real time the signal from the reference magnetic sensor 52 and the variable magnetic sensor 53 in a predetermined sampling intervals, and calculates the coordinates of the position in the variable magnetic sensor 53 with its origin at the position of the reference magnetic sensor 52 using the direction and the angle of the magnetic field detected by the reference magnetic sensor 52 and the direction and the angle of the magnetic field detected by the variable magnetic sensor 52. In other words, the position of the reference magnetic sensor 52 becomes the reference position of the variable magnetic sensor 53. Also, the position measurement unit 54, at the time that the registration button of the variable magnetic sensor 53 is pushed, reads out and registers the spatial position of the variable magnetic sensor 53 at the time that the registration button is pushed. In concrete terms, the coordinate value of the read out variable magnetic sensor 53 is registered in the storage unit 38 via the control unit 14.

The control unit 14 comprises a CPU (central processing unit), and controls the operation of the magnetic unit 50 in addition to the operation control of the above-described light source unit 10, light measurement unit 12, signal processing unit 34, display unit 36 and reference image creating unit 42, so as to implement the respective functions for magnetic-field measurement using the magnetic unit 50. The configuration of the control unit 14 for actualizing these respective functions is shown in FIG. 3.

Figure 3:
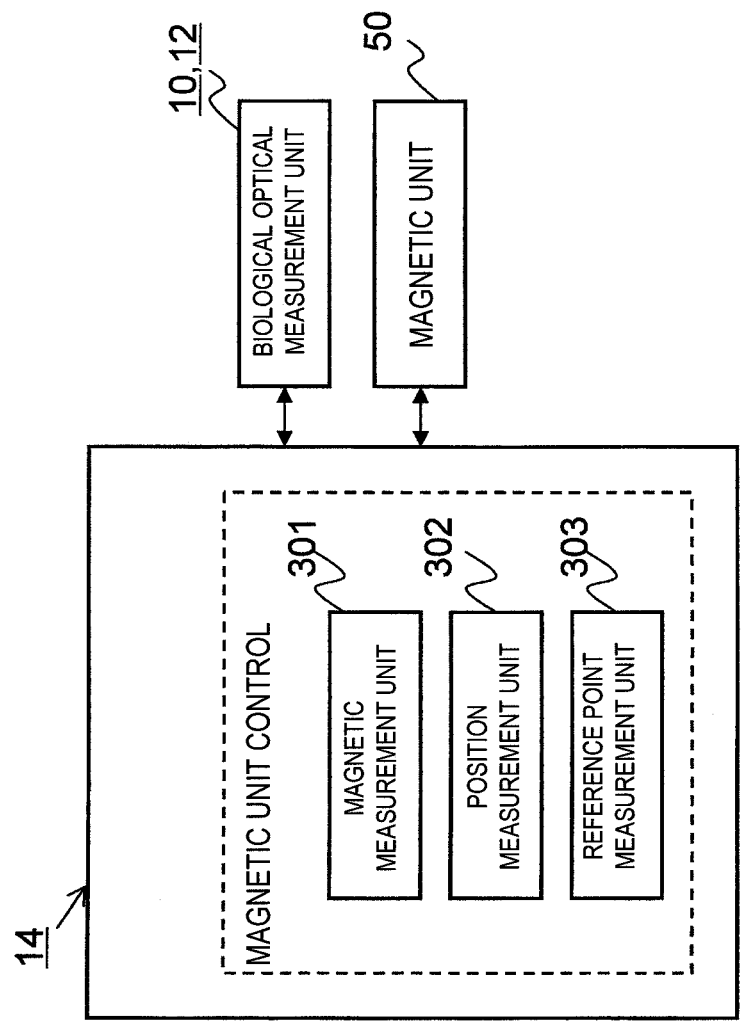
FIG. 3 is a block diagram for explaining the magnetic-field measurement program to be executed by a control unit of an inspection device.

As shown in FIG. 3, the control unit 14 has an environmental magnetic-field measurement unit 301, a probe position measurement unit 302 and a reference point measurement unit 303 in order to perform the function to control the magnetic unit. In the diagram, general functions to be executed by the control unit 14, for example various signal-processing using a biological optical measurement instrument or the result thereof is omitted. These functions are previously stored in the storage unit 38 as programs, and implemented when the respective programs are loaded in a memory of the CPU and executed by the CPU. While the function to be actualized by the probe position measurement unit 302 and the reference point measurement unit 303 from among the control functions of the magnetic unit is the same as the publicly known devices, the characteristic of the present invention is, prior to the activation of an apparatus, that the function to measure the magnetic field of the environment where the apparatus is placed can be provided.

Figure 4:
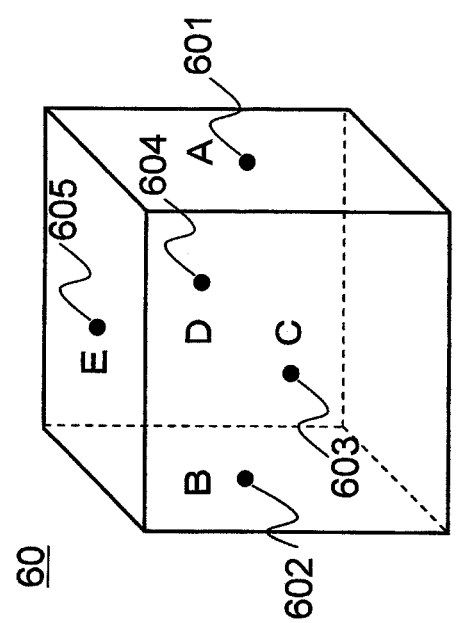
FIG. 4 is a perspective view showing a first embodiment of a jig to be used for magnetic-field measurement.
Figure 5:
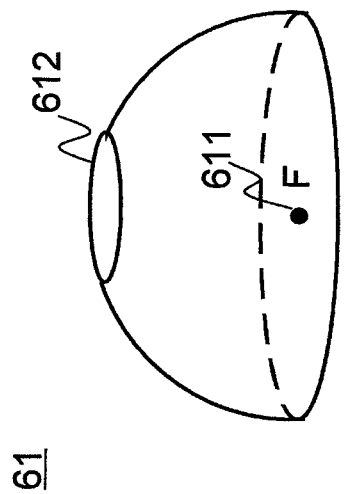
FIG. 5 is a perspective view showing a second embodiment of a jig to be used for magnetic-field measurement.

Environmental magnetic-field measurement to be executed by the biological optical measurement instrument of the present embodiment will be described below referring to FIGS. 4~14. Environmental magnetic-field measurement is executed by activating the magnetic unit 50 using a specific jig. A magnetic-field measurement jig has a predetermined solid form such as a rectangle, hemisphere or a combination of semicircular plates, which has concaves or grooves for the end of the variable magnetic sensor 53 to be engaged at a plurality of positions. FIG. 4–FIG. 6 show the embodiments of the jig to be used for environmental magnetic-field measurement.

First Embodiment of Magnetic-Field Measurement Jig

A jig 60 shown in FIG. 4 is formed by a cube having the same dimension of depth, width and height, and concaves 601~605 or marks for receiving the penpoint of the variable magnetic sensor 53 are formed at the centers A~E of five planes except the basal plane at the time that the cube is placed on a flat surface. The size of the concaves only needs to be, when the penpoint of the variable magnetic sensor 53 is applied, enough to temporarily hold the applied penpoint and to prevent the hand from jiggling. The marks are provided with the color which is different from the color of the jig 60. The jig 60 is capable of measuring the strain in a magnetic field by measuring the distance from one concave, for example the center E (concave or a mark 605) of the top surface to the centers A~D of the other planes and the distance between the centers of the facing planes by the magnetic unit 50, and comparing the respective measurement values and the actual distance (the size of the given jig:the length of one side).

Second Embodiment of Magnetic-field Measurement Jig

A jig 61 shown in FIG. 5 is formed by a hemisphere having the shape of a circular basal plane covered with a semisphere, and a concave 611 or a mark for receiving the penpoint of the variable magnetic sensor 53 is formed at the center F on the inside of the circular basal plane. Also, an aperture 612 for the variable magnetic sensor 53 to be inserted is formed at the top of the hemisphere. The jig 61 is capable of measuring the strain of a magnetic field by measuring the distance from the center F to the surface of the sphere by the magnetic unit 50 on the basis of the position at which the concave 611 or the mark is provided, i.e. the central position F of the sphere and comparing the measured distance and the actual distance which is the radius of the sphere.

Third Embodiment of Magnetic-Field Measurement Jig

A jig 62 shown in FIG. 6(*a*) is a modification of the jig 61 shown in FIG. 5, wherein a part of a hemisphere is cut out in four places and a partial hemisphere 621 formed by two curved strip-shaped bodies that are orthogonal to each other is fixed on a circular basal plane 622. While a concave 624 or a mark for receiving the penpoint of the variable magnetic sensor 53 is formed at the center F on the inside of the circular basal plane as in the second embodiment, the cutout parts of the hemisphere are used as apertures for the variable magnetic sensor 53 to be inserted in place of the aperture 612 in the second embodiment. Also, grooves 623 or lines for receiving the penpoint of the variable magnetic sensor 53 are formed along the longitudinal direction of the strip-shaped bodies at the center thereof in the width direction.

The jig 62 is capable of measuring the strain of a magnetic field by measuring the distance from the center F to the groove (line) by the magnetic unit 50 on the basis of the central position F of the sphere and comparing the measured distance with the actual distance which is the radius of the sphere.

Fourth Embodiment of Magnetic-Field Measurement Jig

A jig 63 shown in FIG. 6(*b*) is a modification of the jig 62 shown in FIG. 6(*a*), wherein two pieces of semicircular planes 631 and 632 are fit together to be orthogonal to each other and fixed onto a circular basal plane 633. A concave 634 or a mark for receiving the penpoint of the variable magnetic sensor 53 is formed at the center of the circular basal plane 633, and a groove 635 or a line for receiving the penpoint is formed on the side surface equivalent to the arc of the semicircular planes 631 and 632. The method for measuring the strain of a magnetic field is the same as in the third embodiment.

While the respective embodiments of the magnetic-field measurement jig related to the present invention has been described above, various kinds of alteration or modification of its shape, etc. can be made with respect to the above-described embodiments.

Next, embodiments of the magnetic-field measurement method using the above-described magnetic-field measurement jigs will be described. In the following embodiments, concaves to be provided to the respective jigs can be replaced with marks, and grooves can be replaced with lines respectively.

First Embodiment of Magnetic-Field Measurement Method

Figure 7:
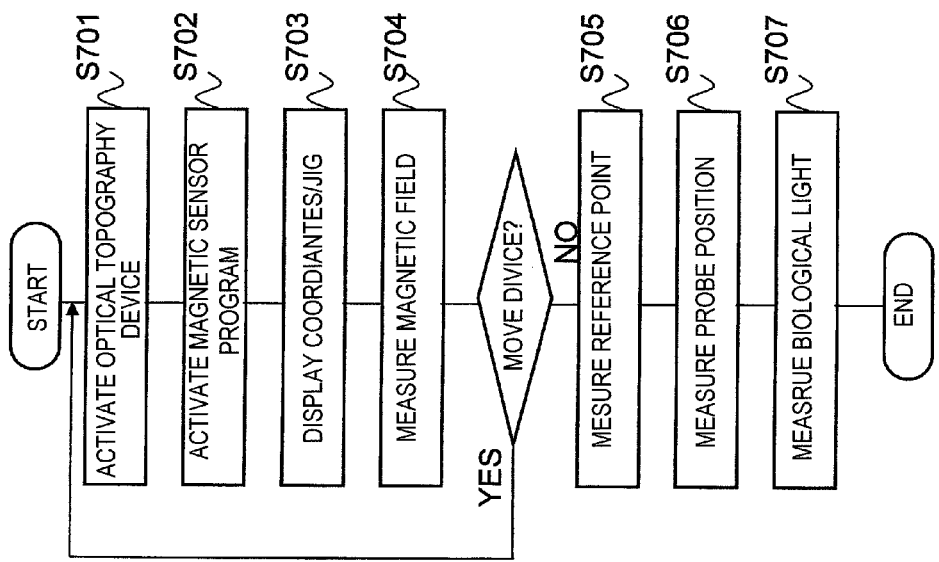
FIG. 7 is an operation flow of biological optical measurement.
Figure 8:
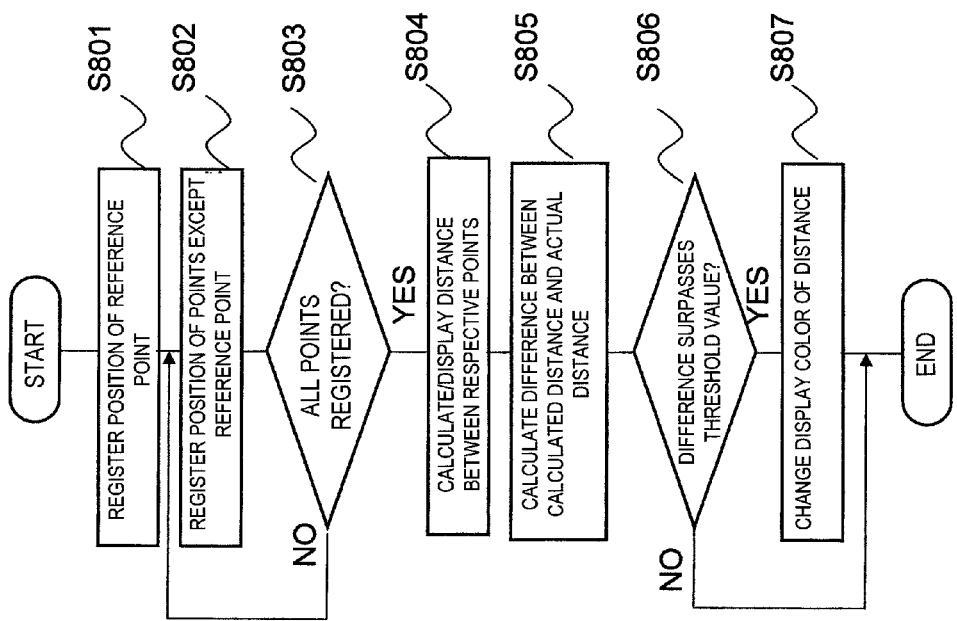
FIG. 8 shows an operation flow of the first embodiment of the magnetic field measurement method.

The operation of a control unit in the case of using the jig 60 shown in FIG. 4 will be described as the first embodiment. FIG. 7 and FIG. 8 show the operation flow of the control unit 14 including the positional measurement using the jig 60 and the magnetic unit 50.

First, upon activating an optical topography device, an operator sets the jig 60 and the magnetic unit 50 at predetermined positions in the vicinity of the optical tomography device. It is preferable that the jig 60 is placed at approximately the same place where an inspection region of an object is to be placed. For example, when the inspection region is the head region of an object, the basal plane of the jig 60 is placed horizontally to the surface at the height where it is estimated that the head region of the object is to be placed while sitting on a chair.

The magnetic source 51 and the reference magnetic sensor 52 of the magnetic unit 50 are placed in the vicinity of the jig 60. At this time, it is preferable that three axes of the magnetic field generated by the magnetic source 51 coincide with the three axes of the cube-formed jig 60.

When the above-described preparation is completed, the optical topography device is started up (step S701). In this manner, a menu screen for executing the respective functions of the optical topography device is displayed on the display unit 36. When position measurement is selected via the menu screen, a magnetic sensor program is activated (step S702). When the magnetic sensor program is activated, the operation of the magnetic unit 50 is started, which creates the condition that the positional information detected by a variable magnetic sensor can be read out in real time.

Figure 9:
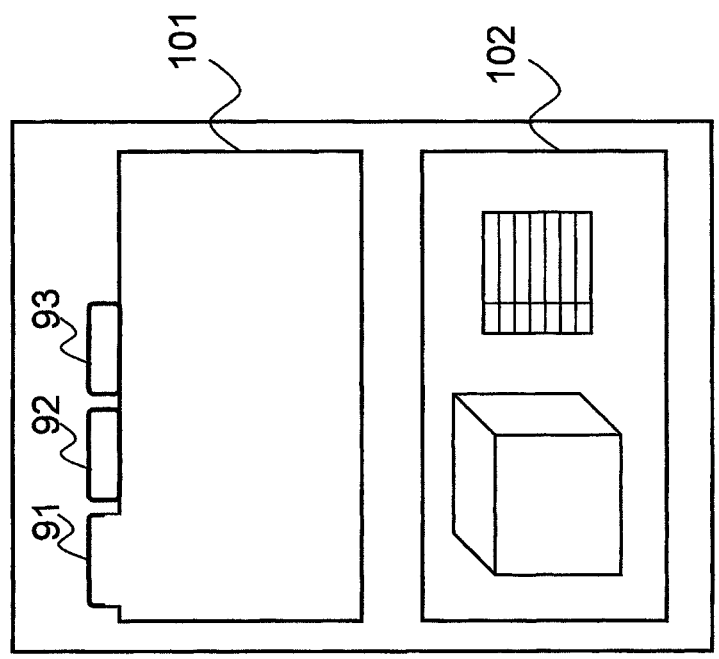
FIG. 9 shows a display screen example in the embodiment of FIG. 8.
Figure 10:
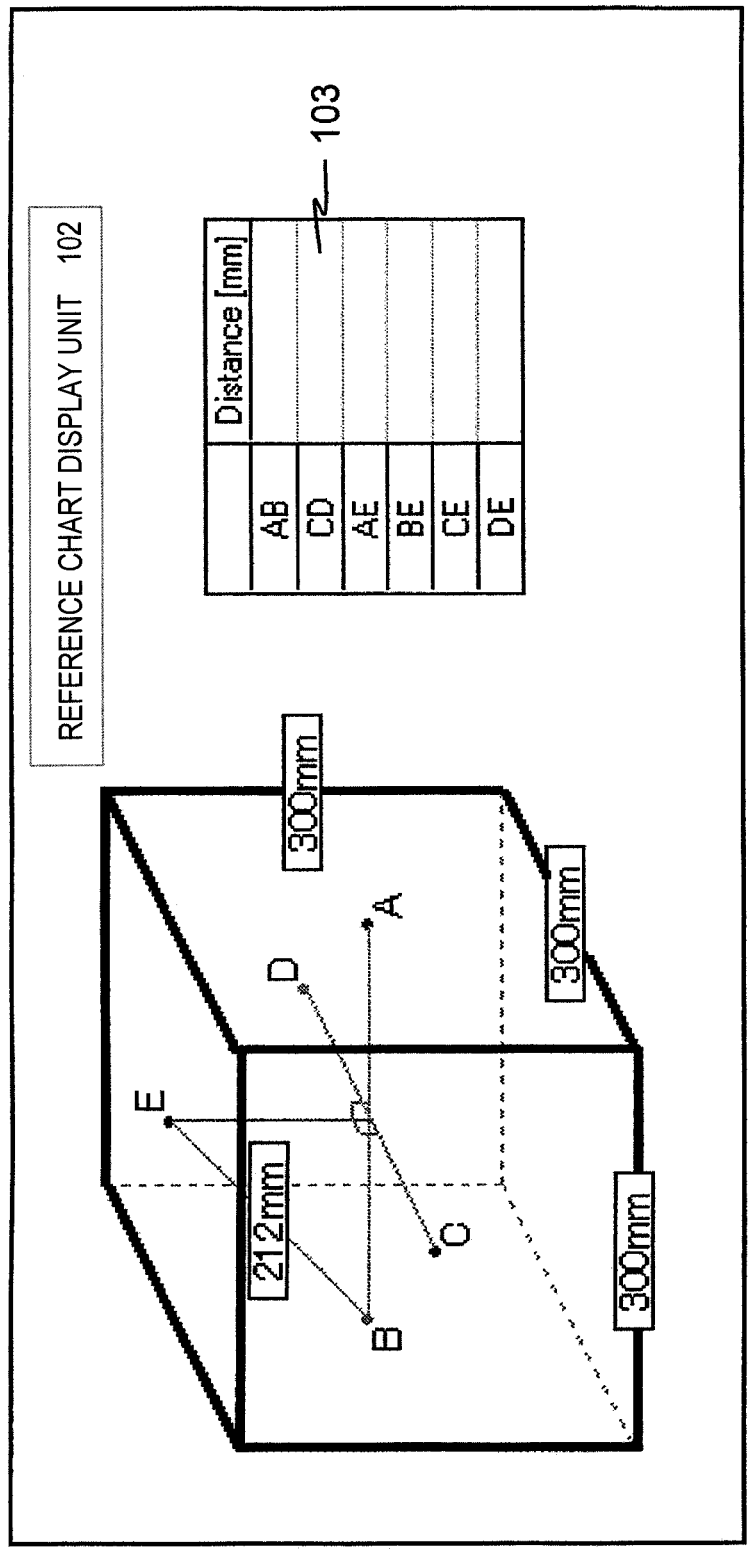
FIG. 10 shows a display screen example in the embodiment of FIG. 8.

Also by the activation of the magnetic sensor program, the operation mode of the magnetic sensor is displayed on the display unit 36 (step S703). An example of the display screen is shown in FIG. 9 and FIG. 10. In the example shown in the diagram, it is set so that the operation modes to be executed by the magnetic sensor program, i.e. the mode for measuring the environmental magnetic field at which the device is placed (magnetic-field measurement mode), the mode for measuring the setting positions of the respective optical fibers commanded by the variable magnetic sensor 53 (position measurement mode) and the mode for measuring the position of anatomic reference points of the object (reference-point measurement mode) can be executed by selecting the relevant tabs 91~93.

The tab 91 for magnetic-field measurement mode is selected on the screen shown in FIG. 9, and the state of the jig to be used or magnetic-field measurement is displayed thereon. The display screen is separated into a coordinate value display unit 101 and a reference chart display unit 102, and the coordinate value of the end of the variable magnetic sensor 53 is displayed on the coordinate value display unit 101. In the present embodiment, registration of the position of a plurality of (for example, five) points on the jig 60 are sequentially received, and the received values are sequentially displayed. The display on the coordinate value display unit 101 also functions as the guidance to notify an operator the order of the plurality of positions for registration. For example, by five points of A~E on the jig 60 being displayed in order of the positions A, B, C, D and E from top down on the coordinate value display unit 101, the operator can measure the positions on the jig 60 (the positions provided with the concaves 601~605) in that order.

On the reference chart display unit 102, as shown in FIG. 10, the shape of the jig 60 to be used for magnetic-field measurement and the specified points A~E on the jig 60 are displayed, along with the actual distance between the respective points. Since the jig 60 has a cubic shape, the distance between the A-B and C-D is the same as the length of one side of the cube, and the distance between the central point E on the top surface and the centers A, B, C and D of the respective side surfaces are the same. The former is displayed as 300 mm and the latter is displayed as 212 mm in the example shown in the diagram. Also, the distance (measurement values) calculated from the position of the respective points measured by the magnetic-field measurement to be described later are displayed as table 103 on the reference chart display unit 102. The values to be displayed in this table stay blank until the start of measurement.

After the magnetic-field measurement mode is selected, the operator starts the measurement according to the order of the points displayed on the coordinate value display unit 101 (step S704 and the respective steps in FIG. 8), First, the end of the variable magnetic sensor 53 is applied to the concave 601 at point A of the jig 60 and pushes the registration button. In this manner, the magnetic unit 50 measures the relative position of the variable magnetic sensor 53 with respect to the reference magnetic sensor 51, and transmits the measured value to the control unit 14 (magnetic-field measurement unit 301). The magnetic-field measurement unit 301 registers the position of point A as a coordinate reference point (step S801). On the coordinate value display unit 101, the coordinates (0, 0, 0) are displayed at the position of point A. Next, when the operator applies the end of the variable magnetic sensor 53 to the concave 602 at point B of the jig 60 and pushes the registration button, the position (coordinates) of point B measured by the magnetic unit 50 is transmitted to the magnetic-field measurement unit 301, the coordinates of the point B are converted to the relative position having the origin at point A and registered (step S802). The coordinates of B are displayed on the coordinate value display unit 101. Also for points C, D and E, each time that the operator sequentially executes position measurement, the positional information is transmitted to the magnetic-field measurement unit 301, the coordinates having the origin at point A are calculated and displayed as the coordinates of the respective points in the coordinate value display unit 101 (step S803).

In parallel with these steps, at the point that the registration of point A and the position measurement of point B are completed, the magnetic-field measurement unit 301 calculates the distance between point A and point B from these coordinates, and displays the calculated distance on the table 103 of the reference chart display unit 102 (step S804). Next, when the position measurement of point C and point D is completed, the distance between point C and point D are calculated from these coordinates and displayed on the table 103. When the position measurement of point E is finally completed, the distance between point E and the respective points A~D are calculated respectively and displayed on the table 103.

Further, the magnetic-field measurement unit 301 comprises a magnetic-field determination unit configured to calculate the distance between the respective points of the jig using the positional information of the detected plurality of points to determine the presence of a magnetic field on the basis of the comparison result between the calculated distance and the actual distance between the respective points. In concrete terms, the magnetic-field measurement unit 301 compares the calculated distance (measurement value) between the respective points to the actual distance (step S805). When the calculated difference surpasses a predetermined threshold value, the result is displayed (steps S806, S807). There are various kinds of display methods in the case that the distance surpasses the threshold value. For example, the numeric values in the table 103 or the display color of AB, CD and so on can be differentiated from the case that the calculated distance does not surpass the threshold value, or a column can be provided which indicates the difference between the measured value and the actual value or a message that the difference surpasses the threshold value. The threshold value differs depending on the degree of accuracy of the measurement device, and it is preferable to set the threshold value which is slightly greater than the measurement accuracy of the apparatus (for example, 3 mm) for the optical topography device having the measurement accuracy of about 2 mm.

By observing the display of the table 103, the operator can confirm the direction of the strain generated in a magnetic field, so that material or furniture that causes the strain in the magnetic field can be eliminated or appropriate measures can be taken such as moving the optical topography device. In the case that the setting position of the device is changed, the above described steps S701~S704 are repeated. After taking the above-mentioned appropriate measures, the reference measurement mode and the position measurement mode for biological optical measurement are activated (FIG. 7: steps S705 and S706).

While omitting the detailed description of the operation flow of the reference-point measurement and the position measurement since they are the same as those in a conventional optical topography device, the simple explanation thereof is as follows. First, the probe is applied on the inspection region of the object and the reference magnetic sensor 52 is affixed to the head region (arbitrary places) of the object, and the reference points in the inspection region are registered (step S705). This operation is carried out by selecting the tab of the reference-point measurement mode 93 from the screen shown in FIG. 9 using the GUI (not shown) displayed on the display unit 36. The reference points in the inspection region are the positions that are anatomically set in biological optical measurement. Specifically, they are a nasion (nasal root), a right ear upper-end portion and a left ear upper-end portion defined by the ten-twenty electrode system of the International Federation of clinical neurophysiology. On the display unit 36, an image of a human head region created by the reference image creating unit 42 and the positions of the reference points are displayed with indication of the order for measurement. The operator sequentially positions the variable magnetic sensor 53 at the position of the relevant reference point in the object using the image displayed on the display unit as a guide and pushes the registration button, and the positions of the reference points in the object are measured and registered. The coordinates of these reference points are registered in the storage unit 38.

Next, the setting positions of optical fiber that are the end of the irradiating optical fibers and the detecting optical fibers are sequentially detected by the variable magnetic sensor 53 and registered (step S706). This operation is carried out by selecting the tab of the position measurement mode 92 from the screen shown in FIG. 9 using the GUI displayed on the display unit 36. In other words, on the display unit 36, the arrangement of the ends of optical fibers in the probes is displayed with indication of the order for the position measurement. The operator sequentially positions the variable magnetic sensor 53 at the setting position of optical fibers in the probes applied on the object and pushes the registration button, and the spatial positions of the optical fiber setting positions in the probes are measured and registered. The coordinates of these reference points are registered in the storage unit 38. These coordinates of the spatial positions are used at the time of synthesizing the previously registered position of the reference points and the topography which is the result of optical measurement with a 3-dimensional model of a human or a 3-dimensional image (a head-surface image or a brain-surface image) of the object 22.

When the above-described position measurement is completed, optical measurement is carried out (step S707). The method of optical measurement is the same as the method used for commonly-known optical topography devices. The outline is, for example, in the condition that an assignment such as speech or tapping is given to an object, light is irradiated to the head region of the object via the irradiating optical fibers 20 from the light source unit 10 and the transmitted light induced from the detecting optical fibers 26 are detected by the light measurement unit 12. The light induced to the detecting optical fibers 26 is the transmitted light from the position on the brain surface (measurement point) between the end of the relevant detecting optical fibers and the irradiating optical fibers disposed by surrounding the detecting optical fibers, and is converted into a hemoglobin variation signal by the lock-in amplifier 30 for each measurement point. The signal processing unit 34 creates the distribution map, i.e. an optical topography of the brain-surface region including the respective measurement points using the hemoglobin variation signal (the signal after digital conversion) of each measurement point. The created optical topography is pasted on the 3-dimensional image (head-surface image or brain-surface image) of the object 22 created by the reference image crating unit based on the positional information of the reference points and the respective measurement points stored in the storage unit 38, and displayed on the display unit 36.

In accordance with the present embodiment, it is possible to perform optical measurement in the condition from which the cause of strain in a magnetic field is eliminated, by measuring, in prior to the optical measurement, the direction and intensity of the strain in the magnetic field with respect to the environment in which a biological optical measurement instrument is placed. In this manner, accurate information on the positions of probes and optical fibers can be acquired, and result images can be provided with high accuracy.

While the control unit 14 determines whether or not the difference between the measured distance of the magnetic-field measurement jig and the actual distance surpassed the threshold value and the result of determination is displayed on the display screen at the time of magnetic-field measurement in the present embodiment, the distance between the respective points may also be displayed merely as numeric values. In that case, the operator can confirm the presence or absence of strain in a magnetic field by comparing the actual distance displayed on the reference chart display unit 102 and the numeric value displayed on the table 103.

Second Embodiment of Magnetic-Field Measurement Method

Figure 11:
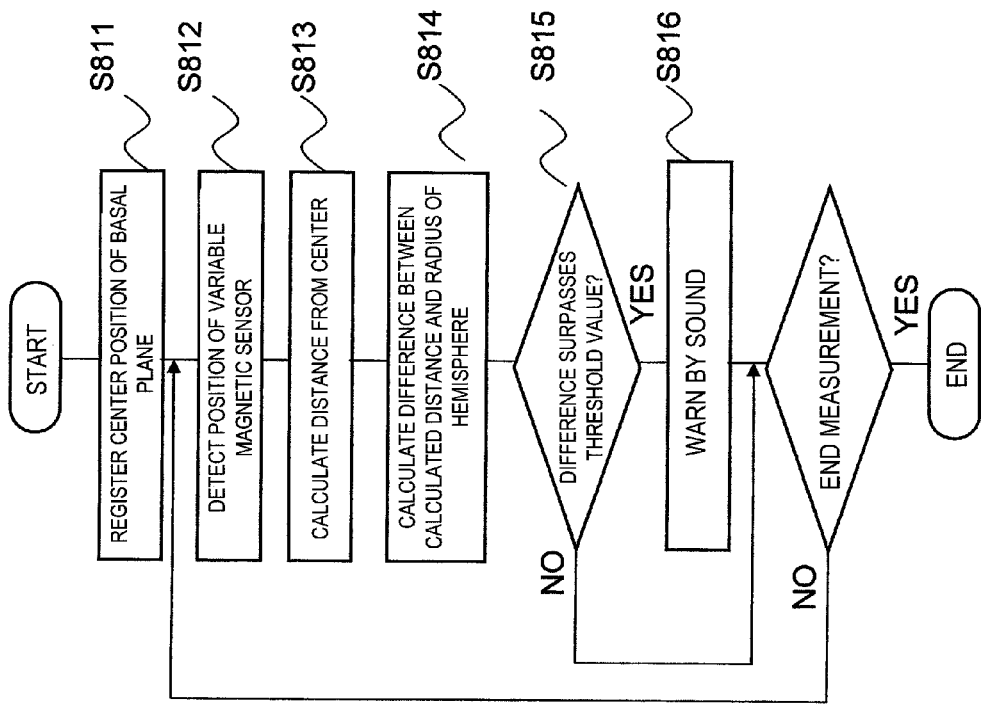
FIG. 11 shows an operation flow of the second embodiment of the magnetic-field measurement method.

Next, operation of the control unit in the case of using the jig 61 shown in FIG. 5 will be described as the second embodiment referring to the operation flow in FIG. 11. Since the basic operation of the optical topography device and the control unit in the present embodiment is also the same as the operation flow in the first embodiment shown in FIG. 7, the difference from the basic operation will be mainly described.

First, upon activating the optical topography device, the jig 61 and the magnetic unit 50 are set at predetermined positions in the vicinity of the optical topography device as in the first embodiment. The magnetic source 51 and the reference magnetic sensor 52 are set in the vicinity of the jig 61. At this time, it is preferable that the axis of the magnetic field generated by the magnetic source 51 coincides with the radius direction of the hemispherical-shaped jig 61.

After the above-described preparation is completed, when the optical topography device and the magnetic sensor program are activated, the display screen from which the respective operation modes of the magnetic sensor can be selected is displayed on the display unit 36. In the present embodiment, the display screen is also formed by the coordinate numeric value display unit (now shown) and the reference chart display unit 122, and the position (coordinates) of the end of the variable magnetic sensor 53 is displayed on the coordinate value display unit in real time.

Figure 12:
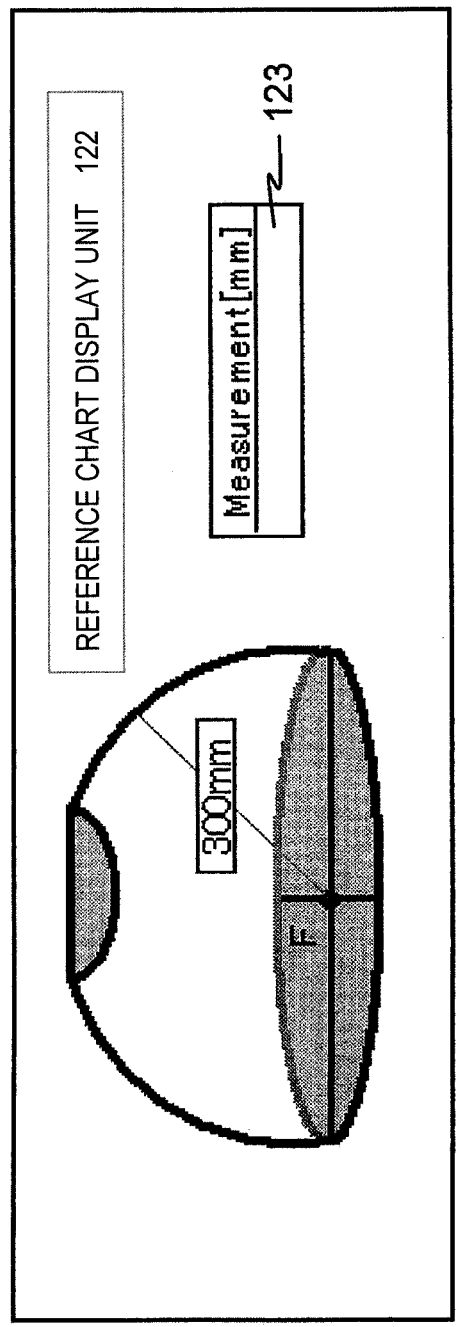
FIG. 12 shows a display screen example of the embodiment in FIG. 11.

On the reference chart display unit 122, as shown in FIG. 12, the shape of the jig 61 to be used for magnetic-field measurement and the center of the basal plane of the jig 61 as a coordinate reference point F are displayed, along with the distance from the point F to the surface of the jig 61, i.e. the radius of the hemisphere. In the example shown in the diagram, the radius is displayed as 300 mm. Also, the distance calculated from the position of the point measured by the magnetic-field measurement to be described later (measurement value) is displayed in a frame 123. The value in this frame stays blank until the measurement starts.

Upon starting the magnetic-field measurement mode, the operator first applies the end of the variable magnetic sensor 53 to the concave at the point F on the center of the basal plane of the jig 61 and pushes the registration button. In this manner, the magnetic unit 50 measures the relative position of the variable magnetic sensor 53 with respect to the reference magnetic sensor 51 and transmits the measured value to the magnetic-field measurement unit 301 of the control unit 14. The magnetic-field measurement unit 301 registers the position of the point F as the coordinate reference point (step S811).

Next, the operator traces an arbitrary place on the jig 61 using the end of the variable magnetic sensor 53. The position measurement unit 54 of the magnetic unit loads the positional information of the variable magnetic sensor 53 in predetermined sampling intervals, and sends it to the magnetic-field measurement unit 301. The magnetic-field measurement unit 301 converts the coordinates of the variable magnetic sensor 53 loaded in predetermined intervals into the relative position having the origin at point F, and displays the converted position on the coordinate value display unit 121 (step S812). At the same time, the magnetic-field measurement unit 301 calculates the distance from the detected position of the end of variable magnetic sensor 53 to point F, and displays it on the frame 123 of the reference chart display unit 122 (step S813). In other words, the distance displayed on the frame 123 is updated in real time according to the positional movement of the end of the variable magnetic sensor 53 which traces the surface of the jig 61. Here, while the distance from center F to the surface (radius) is constant since the surface of the jig 61 is a hemisphere, if strain is generated in a magnetic field, the distance calculated by the magnetic-field measurement unit 301 is not constant and changes.

An annunciation unit configured to annunciate the determination result of the magnetic-field determination unit by a sound, etc. can also be provided. In concrete terms, the magnetic-field measurement unit 301 calculates the difference between the calculated end-position of the variable magnetic sensor 53 to point F and the radius of the hemispherical-shaped jig 61 (step S814). When the difference surpasses a predetermined threshold value, the annunciation unit is activated which causes generation of sound, blinking of warning light or change of display so as to notify the calculation result to the operator (steps S815 and S816). The operator can confirm which direction the strain is generated in a magnetic field by the end-position of the variable magnetic sensor 53 at the time when a warning from the annunciation unit is generated, in order to take appropriate measures for eliminating the strain in the magnetic field.

In the annunciation unit, the display screen in which the colors of the distance can be changed or in which a warning sign can be displayed in the frame 123 can also be used. Also, a warning lamp, sound-generating system such as a sound generator or a speaker may be provided to an optical topography device in addition to or in place of the warning system by a display screen as means for the annunciation. In the case that the input/output unit 40 of an optical topography device comprises sound-generating means such as a sound generator or a speaker, it can be used.

After executing the above-described environmental magnetic-field measurement and taking appropriate measures, position measurement and biological optical measurement are executed as in the first embodiment, and the explanation thereof will be omitted.

In accordance with the present embodiment, there is no need to consider the order of measurements, and the presence or absence of strain in a magnetic field can be verified by merely tracing the surface of the jig 61 using the end of the variable magnetic sensor 53. Moreover, annunciating the presence of strain in a magnetic field by sound makes the verification easier. In this manner, accurate biological optical measurement can be executed in a condition without strain in the magnetic field as in the first embodiment.

Third Embodiment of Magnetic-Field Measurement Method

Figure 13:
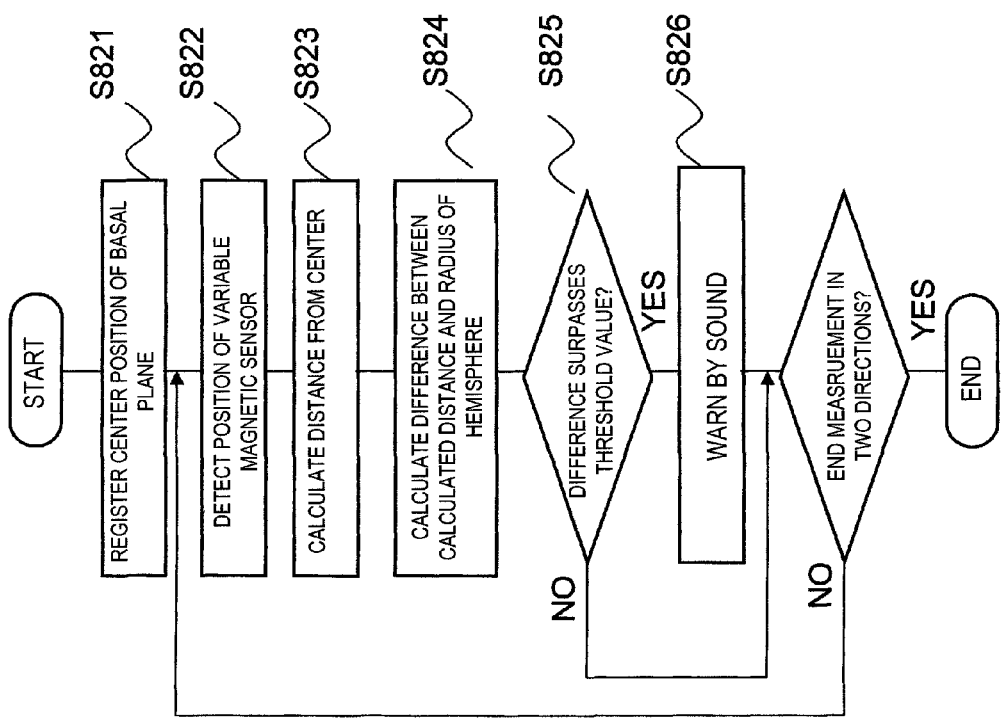
FIG. 13 shows an operation flow of the third embodiment in the magnetic-field measurement method.

Next, the operation of the control unit using the jig shown in FIG. 6 will be described as the third embodiment. The basic operation of the optical topography device and the control unit in the present embodiment is the same as in the first and the second embodiments, thus mainly the difference from these embodiments will be described. FIG. 13 shows the operation flow of the control unit 14 including position measurement using the jig 62 and the magnetic unit 50.

First, as in the first embodiment, the jig 62 and the magnetic unit 50 are set at predetermined positions in the vicinity of an optical topography device upon activating the optical topography device. The magnetic source 51 and the reference magnetic sensor 52 are set in the vicinity of the jig 62. At this time, it is preferable that the axis of the magnetic field generated by the magnetic source 51 coincides with the longitudinal direction of one of the two strips of the jig 62.

After completing the above-described preparation, the optical topography device is activated, and then the magnetic sensor program is activated. In this manner, the display screen on which the respective operation modes of the magnetic sensor can be selected is displayed on the display unit 36.

Figure 14:
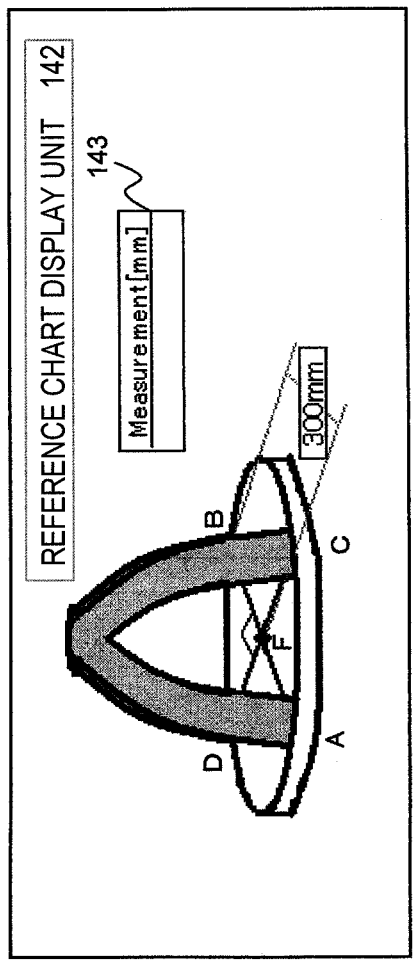
FIG. 14 shows a display screen example in the embodiment of FIG. 13.

On the coordinate value display unit of the display screen, the coordinate value of the end of the variable magnetic sensor 53 is displayed. On the reference chart display unit 142, as shown in FIG. 14, the shape of the jig 62 to be used for magnetic-field measurement and the center of the basal plane of the jig 62 as point F are displayed, along with the distance from point F to one strip of the jig 62, i.e. the radius of the hemisphere. In the example in the diagram, the radius is displayed as 300 mm. Also, the distance (measurement value) calculated from the point which is measured by the magnetic-field measurement to be described later is displayed in a frame 143. Until the measurement is started, the value in this frame stays blank.

At the time of starting the magnetic-field measurement mode, the operator first applies the end of the variable magnetic sensor 53 on the concave at the central point F of the basal plane of the jig 62, and pushes the registration button. In this manner, the magnetic unit 50 measures the relative position of the variable magnetic sensor 53 with respect to the reference magnetic sensor 51, and sends the measured value to the magnetic-field measurement unit 301 of the control unit 14. The magnetic-field measurement unit 301 registers the position of point F as the coordinate reference point (step S821).

Next, the operator traces the groove formed on the strip of the jig 62 from one end A to the other end B by the end of the variable magnetic sensor 53. The position measurement unit 54 of the magnetic unit loads the positional information of the variable magnetic sensor 53 in predetermined sampling intervals, and sends the loaded information to the magnetic-field measurement unit 301. The magnetic-field measurement unit 301 converts the coordinates of the variable magnetic sensor loaded in predetermined sampling intervals into the relative positions having the origin at point F, and displays the converted coordinates on the coordinate value display unit 121 (step S822). At the same time, the magnetic-field measurement unit 301 calculates the distance from the detected end position of the variable magnetic sensor 53 to point F, and displays the calculated distance on the frame 143 of the reference chart display unit 142 (step S823). In other words, the distance displayed on the frame 143 is updated in real time according to the movement of the end-position of the variable magnetic sensor 53 which traces the groove on the jig 62. Here, since the groove on the jig 62 has a semispherical shape, the distance (radius) from center F to the surface is constant, but when there is strain in the magnetic field, the distance calculated by the magnetic-field measurement unit 301 is not constant and changes when strain is generated in the magnetic field.

The magnetic-field measurement unit 301 calculates the difference between the distance from the calculated end-position of the variable magnetic sensor 53 to point F and the radius of the groove which has the shape of a semi-circular arc (step S824), and when the calculated difference surpasses a predetermined threshold value, the annunciation unit is activated to inform the operator by generation of sound, blinking of warning light or variation of display as in the second embodiment (steps S825 and S826). The operator can confirm the direction of the generated strain in the magnetic field from the end-position of the variable magnetic sensor 53 at the time that the warning is generated from the annunciation unit and take appropriate measures for eliminating the magnetic field. The same process (steps S822~S826) is executed with respect to the other strip of the jig 62 so as to detect the direction of the generated strain in the magnetic field.

Though not shown in the diagram, at the time of scanning a strip of the jig 62 by the variable magnetic sensor 53, the coordinates of one end of the strip and the other end of the strip may be respectively registered in advance by the registration button, and when the registration from one end to the other end is completed, the distance between one end and the other end may be calculated from the registered coordinates and the calculated distance or the distance between the relevant calculated distance and the actual distance, i.e. the diameter of the semicircle (600 mm here) may be displayed on the reference chart display unit 142. In this case, as in the first embodiment, when the difference between the calculated distance and the actual distance surpasses a predetermined threshold value, the message can be displayed.

While the direction of strain in a magnetic field which can be detected by the present embodiment is limited compared to the second embodiment, the configuration of the jig can be simplified, and scanning of the surface of the jig 62 by the variable magnetic sensor 53 can be executed more easily with high repeatability since a groove is provided thereon. In addition, restriction of detectable magnetic-field direction can be reduced, for example by executing remeasurement by changing the setting direction of the jig 62 on the set plane thereof.

The present embodiment can also be applied to the magnetic-field measurement using the jig 63 in exactly the same manner by replacing the groove formed on the two strip-shaped bodies of the jig 62 shown in FIG. 6(a) with the groove formed on the circular arcs of the semicircular boards of the jig 63 shown in FIG. 6(b).

While the operation flow of the cases using the different jigs is described above as the first~third embodiments of magnetic-field measurement, these respective embodiments can also be set as selective in the magnetic-field measurement program. In such a case, for example, the jig selecting flow can be added in the magnetic-field measurement program so that the magnetic-field measurement mode that uses the selected jig can be executed.

Also, while the above-described embodiments use a magnetic unit having a magnetic source and two magnetic sensors and calculation of the coordinates of the position detected by the magnetic sensor is executed by the position measurement unit 54 of the magnetic unit 50, it also is possible that the function of the position measurement unit 54 of the magnetic unit 50 is configured to be served by the control unit 14 of a biological optical measurement instrument. The magnetic unit can also be configured by a magnetic source and one variable magnetic sensor. In such a case, one position which is detected by the variable magnetic sensor is registered as the reference position, and the relative position with respect to the reference position is calculated by the position measurement unit.

Further, while the embodiments in which the present invention is applied to a biological optical measurement instrument, specifically an optical topography device are exemplified above, the present invention can be applied to any instrument comprising a device for measuring biological information and a position detector for magnetically detecting the position of the instrument in a real space, having a function to synthesize the biological information measured by the instrument and an image of an object placed in the real space or to display the image of the region measured by the instrument using the position of the instrument in the real space.

Such instruments, in concrete terms, are an ultrasonic diagnostic apparatus, a surgery navigation system using a CT apparatus disclosed in JP-A-2005-296436 or Japanese Patent No. 3871747, and so on.

INDUSTRIAL APPLICABILITY

In accordance with the present invention, it is possible to obtain inspection result on the basis of accurate positional information obtained by an inspection device using a magnetic position detector.

DESCRIPTION OF REFERENCE NUMERALS 10 light source unit
12 light measurement unit
14 control unit
20 optical fiber
26 optical fiber
36 display unit
38 storage unit
50 magnetic unit
51 magnetic source
52 reference magnetic sensor
53 variable magnetic sensor
60~62 magnetic-field measurement jig
301 magnetic-field measurement unit
302 position measurement unit
303 reference-point measurement unit

The invention claimed is:

1. An inspection device comprising:
a biological information measurement unit configured to measure biological information of an inspection target and form an image including the biological information;
a magnetic position detector configured to detect a position of the biological information measurement unit and/or the inspection target;
a control unit configured to control the biological information measurement unit and the magnetic position detector, the control unit comprising a magnetic-field measurement unit configured to measure strain of a magnetic field in a measurement space in which the biological information measurement unit is placed using an output of the magnetic position detector; and a magnetic-field measurement jig formed by a polyhedron, and has concave portions or marks for engaging a part of a magnetic sensor each one of the concave portions or marks being disposed at a part or all of a plane that forms the polyhedron, wherein the output of the magnetic position detector is positional information corresponding to the concave portions or marks of the plurality of points of a jig affixed in the measurement space, and wherein the magnetic-field measurement unit measures strain of a magnetic field based on the positional information of the detected plurality of points.

2. The inspection device according to claim 1, further comprising:

a display unit configured to display the positional information of the plurality of points detected by the magnetic position detector and actual positional information of the plurality of points.

3. The inspection device according to claim 1, further comprising:

a magnetic-field determination unit configured to calculate the distance between the respective points of the jig using the positional information of the detected plurality of points, and determines the presence or absence of a magnetic field based on a comparison result of the calculated distance and the actual distance between the respective points.

4. The inspection device according to claim 3, further comprising:

an annunciation unit configured to annunciate a determination result of the magnetic-field determination unit by sound.

5. The inspection device according to claim 1, wherein the biological information measurement unit is any of a biological optical measurement instrument, an ultrasonic diagnostic apparatus or an X-ray CT apparatus.

6. An inspection device comprising:

a biological information measurement unit configured to measure biological information of an inspection target and form an image including the biological information;

a magnetic position detector configured to detect a position of the biological information measurement unit and/or the inspection target;

a control unit configured to control the biological information measurement unit and the magnetic position detector, the control unit comprising: a magnetic-field measurement unit configured to measure strain of a magnetic field in a measurement space in which the biological information measurement unit is placed using an output of the magnetic position detector; and a magnetic-field measurement jig formed by a circular basal plane and a hollow hemisphere which covers the basal plane, comprising concave portions or marks for engaging a part of a magnetic sensor, one the concave portions or marks being disposed at the center of the basal plane, and has an opening at the top portion of the hemisphere for the magnetic sensor to be inserted, wherein the output of the magnetic position detector is positional information corresponding to the concave portions or marks of the plurality of points of a jig affixed in the measurement space, and wherein the magnetic-field measurement unit measures strain of a magnetic field based on the positional information of the detected plurality of points.

7. The inspection device according to claim 6, further comprising:

a display unit configured to display the positional information of the plurality of points detected by the magnetic position detector and actual positional information of the plurality of points.

8. The inspection device according to claim 6, further comprising:

a magnetic-field determination unit configured to calculate the distance between the respective points of the jig using the positional information of the detected plurality of points, and determines the presence or absence of a magnetic field based on a comparison result of the calculated distance and the actual distance between the respective points.

9. The inspection device according to claim 8, further comprising:

an annunciation unit configured to annunciate a determination result of the magnetic-field determination unit by sound.

10. The inspection device according to claim 6, wherein the biological information measurement unit is any of a biological optical measurement instrument, an ultrasonic diagnostic apparatus or an X-ray CT apparatus.

11. An inspection device comprising:

a biological information measurement unit configured to measure biological information of an inspection target and form an image including the biological information;

a magnetic position detector configured to detect a position of the biological information measurement unit and/or the inspection target;

a control unit configured to control the biological information measurement unit and the magnetic position detector, the control unit comprising: a magnetic-field measurement unit configured to measure strain of a magnetic field in a measurement space in which the biological information measurement unit is placed using an output of the magnetic position detector; and a magnetic-field measurement jig, wherein the magnetic-field measurement jig comprises: a circular basal plane; and a member fixed to the basal plane, the member including two semicircular arcs that are vertical to the basal plane and orthogonal to each other, wherein the member is provided with grooves or lines for a magnetic sensor to be moved along the semicircular arcs, wherein the output of the magnetic position detector is positional information along the semicircular arcs of the plurality of points of a jig affixed in the measurement space, and wherein the magnetic-field measurement unit measures strain of a magnetic field based on the positional information of the detected plurality of points.

12. The inspection device according to claim 11, further comprising:

a display unit configured to display the positional information of the plurality of points detected by the magnetic position detector and actual positional information of the plurality of points.

13. The inspection device according to claim 11, further comprising:

a magnetic-field determination unit configured to calculate the distance between the respective points of the jig using the positional information of the detected plurality of points, and determines the presence or absence of a magnetic field based on a comparison result of the calculated distance and the actual distance between the respective points.

14. The inspection device according to claim 13, further comprising:
an annunciation unit configured to annunciate a determination result of the magnetic-field determination unit by sound.

15. The inspection device according to claim 11, wherein the biological information measurement unit is any of a biological optical measurement instrument, an ultrasonic diagnostic apparatus or an X-ray CT apparatus.

* * * * *